United States Patent [19]
Kondo et al.

[11] Patent Number: 5,299,097
[45] Date of Patent: Mar. 29, 1994

[54] ELECTRONIC PART MOUNTING BOARD AND SEMICONDUCTOR DEVICE USING THE SAME

[75] Inventors: Mitsuhiro Kondo; Katsumi Sagisaka, both of Oogaki, Japan

[73] Assignee: Ibiden Co., Ltd., Gifu, Japan

[21] Appl. No.: 41,327

[22] Filed: Mar. 31, 1993

[30] Foreign Application Priority Data

May 15, 1992 [JP] Japan .................. 4-123405

[51] Int. Cl.⁵ ............................. H05K 7/18
[52] U.S. Cl. ................. 361/813; 361/736; 361/774; 361/776; 257/666; 439/68; 29/827
[58] Field of Search .............. 361/397, 400, 401, 406, 361/408, 421, 736, 760, 761, 774, 776, 813; 257/666, 669, 676, 698, 692; 439/55, 68, 69, 70; 29/827; 437/206, 217, 220

[56] References Cited

U.S. PATENT DOCUMENTS 4,714,952 12/1987 Takekawa .............. 357/75
4,827,376 5/1989 Voss ..................... 361/388

FOREIGN PATENT DOCUMENTS 59-98545 6/1984 Japan .
62-133791 6/1987 Japan .

OTHER PUBLICATIONS

IBM Technical Disclosure Bulletin, Cochran et al, Microcircuit Having Printed Terminals, Apr. 1966, pp. 1483-1484, vol. 8, No. 11.

Primary Examiner—Leo P. Picard
Assistant Examiner—Young Whang
Attorney, Agent, or Firm—Sughrue, Mion, Zinn, Macpeak & Seas

[57] ABSTRACT

An electronic part mounting board and a semiconductor device which may be easily fabricated and have high reliability by preventing deterioration due to heat at the time of fabrication and the occurrence of internal stress. In the electronic part mounting board and the semiconductor device using such electronic part mounting device: a board fixing pin is provided on a lead frame which is provided to surround a circuit board and which has a plurality of leads, in a manner extended from the frame to be coupled to the circuit board to support the circuit board with respect to the frame; and the circuit board and the board fixing pin are coupled to each other by a fitting pin for connecting the two members. Since the circuit board and the lead frame are coupled, heating and caulking are not required. The thermal deterioration of the resin board to be used and internal stress due to heat between the board and the lead frame do not occur. Fault at the time of mounting the electronic part and reduction in the reliability of the finished products are not caused. Since the coupling position may be selected with relatively less restrictions, the degree of freedom of design is large.

14 Claims, 5 Drawing Sheets

ELECTRONIC PART MOUNTING BOARD AND SEMICONDUCTOR DEVICE USING THE SAME

BACKGROUND OF THE INVENTION

1. Field of the Invention

This invention relates to electronic part mounting boards and to semiconductor devices using such electronic part mounting board, and more particularly relates to an electronic part mounting board and to a semiconductor device using the same, having a board fixing pin by which a circuit board for mounting the electronic part may be supported with respect to a lead frame.

2. Description of the Related Art

In recent years, semiconductor elements have been further advanced in their high density construction and it is increasingly more difficult to mount a semiconductor element directly on a printed wiring board or the like to construct various electronic equipment. In recent practice, thus, a semiconductor element is previously mounted for example on a board for mounting the electronic part to form a semiconductor device and such semiconductor device is then electrically connected to a printed wiring board using a surface mount technology or the like. Accordingly, proposals have been made of various boards for mounting electronic parts and of semiconductor devices using the same.

For example, for a semiconductor device internally having an electronic part mounting board integrating a lead frame and a printed wiring board, a circuit board with an electronic part attached thereto must be supported on the lead frame during the fabrication process of the semiconductor device, to connect the electronic part to leads of the lead frame by means of wire bonding. According to a conventional technology disclosed in Japanese Patent Laid-Open Publication No.59-98545, supporting of a circuit board on a lead frame is performed by joining the lead terminals of the lead frame to the conductive layer on the circuit board by means of solder or Au/Sn soldering. Further, in the method disclosed in Japanese Patent Laid Open Publication No.62-133791, the lead of a lead frame is inserted into a through hole formed on a circuit board and the terminal end of the lead is bent to be secured to the through hole by means of caulking.

To use solder or soldering in coupling the circuit board and the lead frame, the junction must be heated at least to 200° C. An ordinarily used board made of a resin may thus be deteriorated due to heat, or an internal stress may occur therein due to the fact that the thermal balance between the circuit board and the lead frame cannot be maintained, resulting in such problems as that fault occurs at the time of mounting the electronic part and that the reliability is reduced of the finished product. Further, in the case where the terminal end of the lead is bent to be caulked, since an individual lead may be integrally formed only at one side of the circuit board, though readily applied to an electronic part mounting board or a semiconductor device of the single in-line package (SIP) type, this bonding method is difficult to be applied to those of other types whereby it cannot be widely used. In addition, since the lead is forcibly caulked to the through hole, a stress is applied to the plating of the through hole to reduce the reliability of the connected portion.

SUMMARY OF THE INVENTION

To solve these problems, an electronic part mounting board is provided in accordance with the present invention, including: a board fixing pin on a lead frame which is provided around a circuit board and has a plurality of leads, said board fixing pin being extended from the frame to be coupled to the circuit board to support the circuit board with respect to the frame; and a fitting pin extended between the circuit board and the board fixing pin to couple the two members.

Further, a semiconductor device is provided in accordance with the present invention, including: a sealing resin sealing by means of a resin a circuit board together with an electronic part; a lead having an inner end embedded in the sealing resin and extended toward the circuit board and an outer end extended externally of the sealing resin; a bonding wire for electrically connecting a conductive circuit of the circuit board to the inner end of the lead; a board fixing pin having an inner end embedded in the sealing resin and coupled to the circuit board, for supporting the circuit board, and a fitting pin extended between the circuit board and the board fixing pin to couple the circuit board and board fixing pin.

Since a fitting pin is used in coupling the circuit board and the lead frame, neither heating nor caulking is required. Accordingly, the thermal deterioration of the resin board to be used and an internal stress due to heat between the board and the lead frame do not occur, thereby faults at the time of mounting an electronic part and a reduction in the reliability of finished products may be prevented. Since, furthermore, individual lead is not to be inserted into a through hole to effect electrical connection thereof, the present invention may be widely used, as it is readily applicable to almost any types of an electronic part mounting board or a semiconductor device, and it is highly reliable in electrical connection.

DETAILED DESCRIPTION OF THE DRAWING

DETAILED DESCRIPTION OF THE PREFERRED EMBODIMENTS

Figure 1:
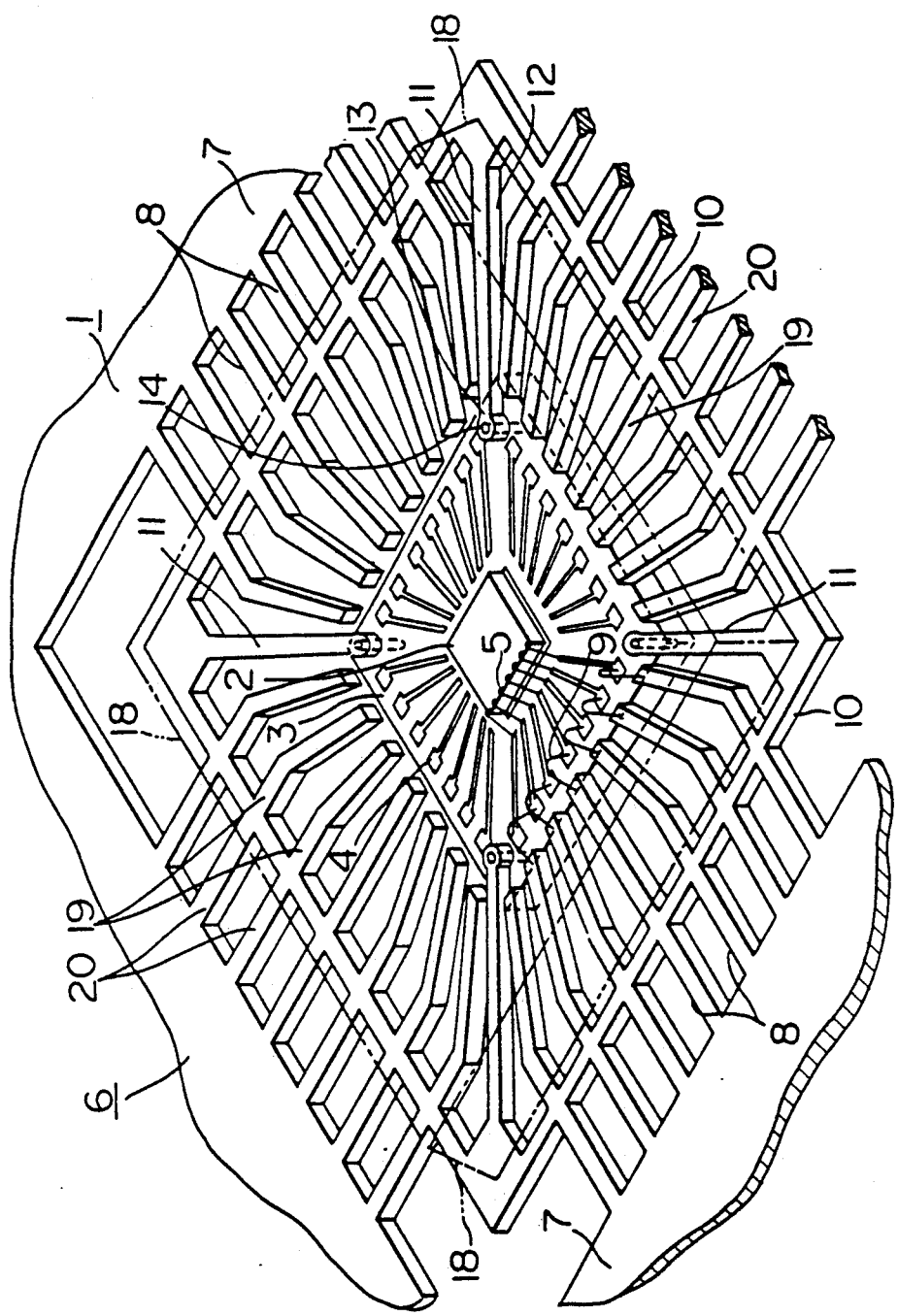
FIG. 1 is a perspective view of an electronic part mounting board of the present invention showing a process during the fabrication of a semiconductor device of the present invention.
Figure 2:
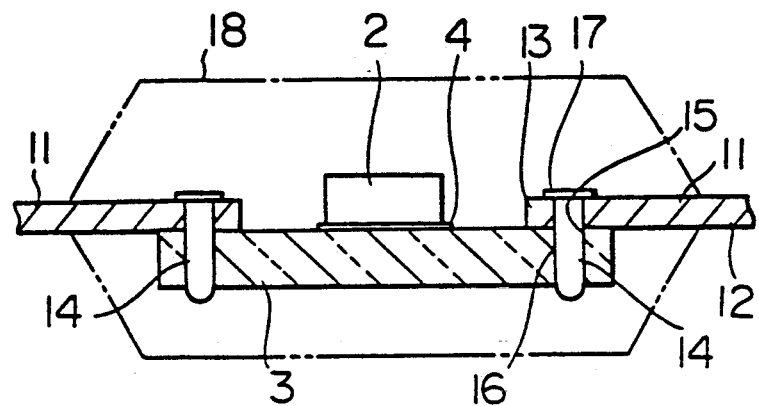
FIG. 2 is a sectional view taken along a diagonal line of the electronic part mounting board of FIG. 1.

FIGS. 1 and 2 show a process during the fabrication of a semiconductor device using an electronic part mounting board of an embodiment of the present invention. An electronic part mounting board 1 has a circuit board 3 for mounting thereon an electronic part 2 such as a semiconductor element. The circuit board 3 is formed of an organic material or a ceramic material such as glass/epoxy, glass/bismaleimide-triazine, glass/polyimide, or teflon, and it has conductive circuits 4 disposed substantially radially on the main surface thereof, each being a pattern conductor having an inner end and an outer end. The electronic part 2 secured to the circuit board 3 is electrically connected to the inner end of the conductor circuit 4 by means of wire bonding 5.

Further, the electronic part mounting board 1 has a lead frame 6 provided to surround the circuit board 3. The lead frame 6 is formed of a metal plate such as a copper-based alloy, 42-alloy (iron:nickel=52:42), or kovar (commercial product name) which are ordinarily used for a lead frame. The lead frame 6 has a frame 7 provided to surround the circuit board 3 with a separation from the circuit board 3. A number of leads 8 are extended from the frame 7 toward the circuit board 3, and the inner end of each lead 8 is at a position separated from the edge of the circuit board 3 and is electrically connected to the conductor circuit 4 of the circuit board 3 by means of a bonding wire 9. A tiebar 10 is extended in parallel to the inner edge of the frame 7 so as to connect a number of leads 8 to one another and is provided to prevent bending of the leads 8 and also to prevent a molding resin from flowing out of the portion between the leads 8 at the time of transfer molding.

According to this invention, the lead frame 6 is further provided with board fixing pins 11 extended inwardly from the frame 7 and coupled with the circuit board 3 so as to support the circuit board 3 with respect to the frame 7. In the example as shown in the figures, each board fixing pin 11 has an outer end 12 supported at a corner portion of the tiebar 10 of the frame 7 as it is integrally coupled thereto and an inner end 13 extended to above the electronic part mounting surface of the circuit board 3, the portion between the inner end 13 of the board fixing pin 11 and the circuit board 3 being firmly coupled to each other by means of a fitting pin 14 which is extended through the circuit board 3 and the board fixing pin 11 so as to connect the two members. As is apparent from FIG. 2 (a section taken along board fixing pins 11 of FIG. 1), in the drawn example, a fitting hole 15 is formed on the inner end 13 of the board fixing pin 11 and a fitting hole 16 is formed at the four corner portions of the circuit board 3, the two ends of the fitting pin 14 being fitted into these fitting holes 15 and 16 so as to fix and support the circuit board 3 with respect to the lead frame 6 by means of the board fixing pin 11. The fitting pin 14 is a substantially cylindrical member as a whole formed of kovar (commercial product name), phosphorus bronze, 42-alloy or the like. The one shown in FIG. 2 has a first end formed semispherically so as to facilitate insertion of the board fixing pin 11 at the fitting holes 15 and 16 and has a second end at which a flange 17 is provided so as to prevent a further inward movement of the fitting pin 14. The relation in dimensions between the fitting pin 14 and the fitting holes 15 and 16 is such that the fitting pin 14 may be inserted therein with a small force to achieve a press fit thereat so that the circuit board may be retained The electronic part mounting board 1 constructed in this manner and having electronic part 2 mounted thereon is then subjected to an ordinary semiconductor device fabrication process to manufacture a semiconductor device. Specifically, a mold (not shown) is used to effect resin-sealing by means of transfer molding using a sealing resin 18 represented by the two-dot chain line in the figure. The leads 8 are cut off from the frame 7 and the tiebar 10 between the leads 8 is punched to obtain a finished semiconductor device. The semiconductor device fabricated in this manner includes: an electronic part 2 such as a semiconductor chip; a circuit board 3 having a pattern conductor circuit 4 wire-bonded to the electronic part 2 and supporting the electronic part 2; a sealing resin 18 sealing the circuit board 3 together with the electronic part 2 by means of a resin; leads 8 provided to surround the circuit board 3, each having an inner lead 19 embedded in the sealing resin 18 and extended toward the circuit board 3 and an outer lead 20 extended externally of the sealing resin 18; bonding wire 9 for electrically connecting the conductor circuit 4 of the circuit board 3 to the inner end of the inner lead 19; a board fixing pin 11 embedded in the sealing resin 18 and having an inner end 13 coupled to the circuit board 3 to support the circuit board 3; and a fitting pin 14 extended between the circuit board 3 and the board fixing pin 11 to couple the two members.

While the electronic part mounting board of the present invention has been described in accordance with the embodiment as shown in FIGS. 1 and 2, various modifications are possible such as the relation between the lead frame and the circuit board and the construction of the fitting pin. Examples of such modification will be described below.

Figure 3:
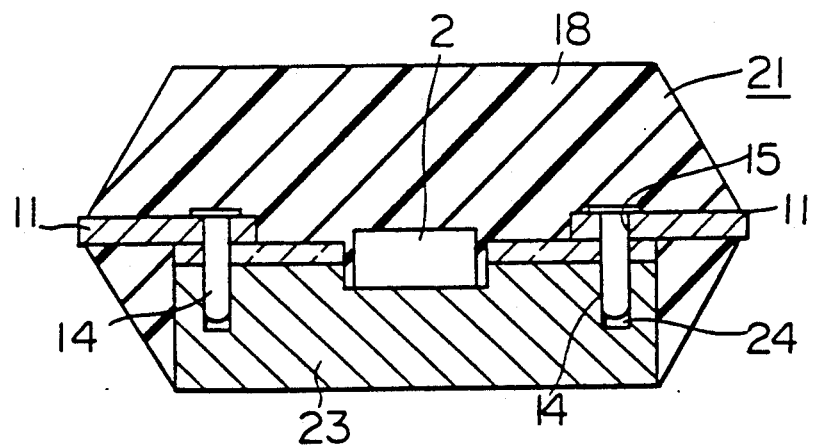
FIG. 3 is a sectional view similar to FIG. 2 of a semiconductor device showing another embodiment of the present invention.

A semiconductor device 21 shown in FIG. 3 is fabricated by using an electronic part mounting board of the present invention, this electronic part mounting board being different from the one as shown in FIGS. 1 and 2 in the shape of its circuit board 23. Specifically, the electronic part mounting board is a single-sided metal core wiring board with a relatively thick copper base which acts as a heat sink. A concave portion is formed at the portion on which the electronic part 2 is mounted, and the bottom surface (the opposite side of the electronic part mounting surface) of the circuit board 23 is exposed from the sealing resin 18. A fitting hole 24 on the circuit board 23 into which the fitting pin 14 is to be press-fitted is a hole with a bottom, not penetrating through the circuit board 23. In this example, heat generated by the electric part 2 may be dissipated directly through the copper-base circuit board 23 which has a relatively large thermal conductivity, thereby a semiconductor device excellent in heat dissipation characteristic may be fabricated at low costs.

Figure 4:
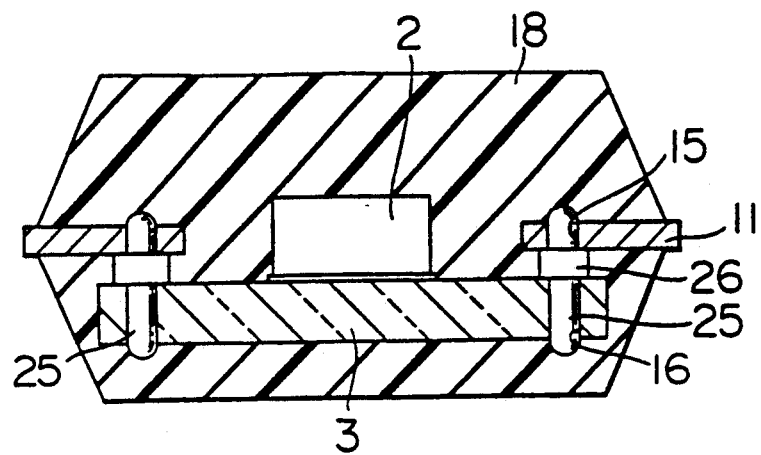
FIG. 4 is a diagonal section of a semiconductor device showing another embodiment of the present invention.

A semiconductor device shown in FIG. 4 is different from the embodiment shown in FIGS. 1 and 2 in that a fitting pin 25 has a flange 26 at a midway point between the two ends thereof. According to this embodiment, attaching of fixing pin 25 is easy and, when the circuit board 3 is anchored to the lead frame 6 by means of this fitting pin 25, the relative position may be selected suitably at all times in the direction of height (vertical direction in FIG. 4) between the circuit board 3 and the lead frame 6, i.e., the inner lead 19. Thereby molding resin may be caused to suitably flow in the mold at the time of transfer molding and bonding may be performed securely and easily to obtain a semiconductor device which is of high quality and which may be easily fabricated. This anchoring may be more securely effected such that the end portion without the flange 26 of the fitting pin 25 is subjected to squeezing after anchoring the circuit board 3 to the lead frame 6.

Figure 5:
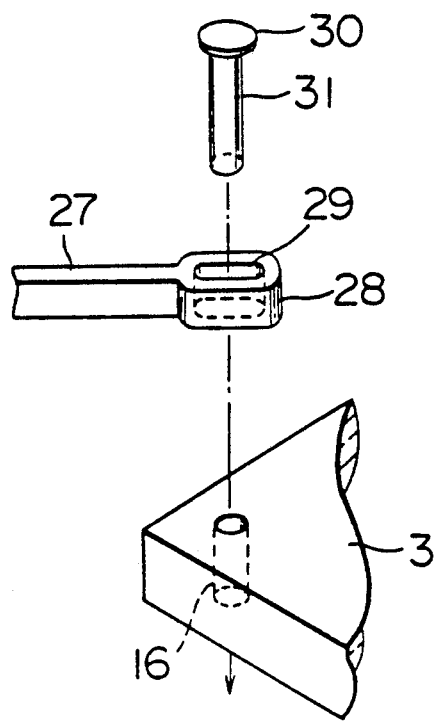
FIG. 5 is an exploded perspective view of another embodiment of the present invention.
Figure 6:
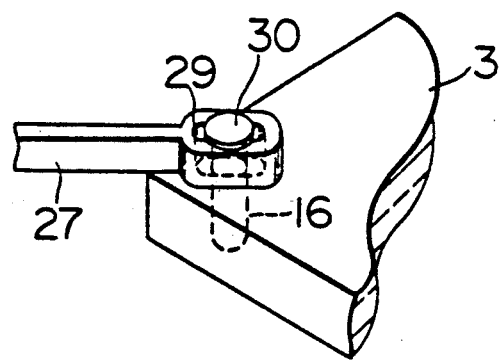
FIG. 6 is a perspective view showing the parts of the embodiment of FIG. 5 in their assembled state.

FIGS. 5 and 6 show an embodiment where a fitting hole 29 formed on an inner end 28 of a board fixing pin 27 for supporting the circuit board 3 on the lead frame 6 is formed as an elongated hole. The longitudinal axis of the elongated hole of the fitting hole 29 is in the same direction as the longitudinal axis of the board fixing pin 27. A fitting hole 16 of a regular circle is formed on the circuit board 3 and a fitting pin 31 having a flange 30 at one end thereof in a similar manner as those shown in FIGS. 1 to 3 is press-fitted to the fitting hole 16 of the circuit board 3 through the fitting hole 29 of the board fixing pin 27. The flange 30 serves to prevent coming out of the fitting pin 31 from the fitting hole 29 of the board fixing pin 27. According to this embodiment, since the fitting hole 29 is an elongated hole, a play for absorbing thermal expansion is formed between the fitting hole 29 and the fitting pin 31. Thus, when the electronic part 2 is mounted on the circuit board 3, the occurrence of a stress due to differential thermal expansion between the circuit board 3 and the lead frame 6 may be prevented in heating for example at the time of wire bonding. Thereby, an electronic part mounting board and a semiconductor device may be obtained, which are of high quality and are highly reliable without internal stress and distortion or warpage of the circuit board 3 and/or the lead frame 6.

Figure 7:
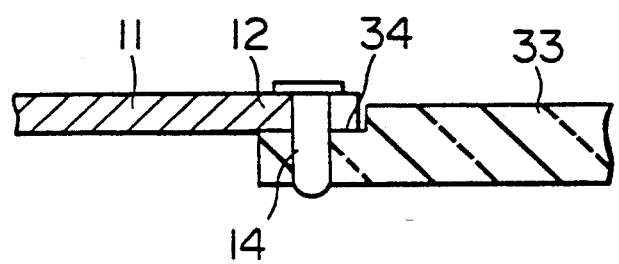
FIG. 7 is a schematic section showing another embodiment of the present invention.
Figure 8:
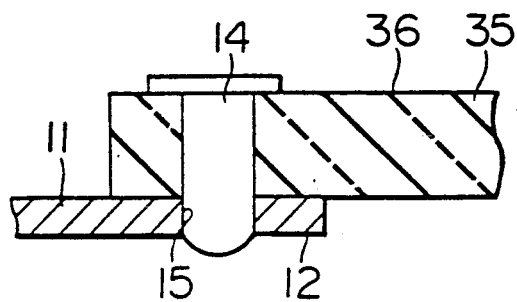
FIG. 8 is a schematic section showing a modification of the embodiment of FIG. 7.

In an embodiment as shown in FIG. 7, a stepped portion or a concave portion 34 for receiving the inner end portion 12 of the board fixing pin 11 is formed on a circuit board 33, so as to reduce the difference in height between the upper surface of the circuit board 33 and the upper surface of the board fixing pin 11. Wire bonding may be facilitated with this construction. Further, if required, the board fixing pin 11 may be provided as shown FIG. 8 on the surface opposite to an electronic part mounting surface 36 of an circuit board 35.

Figure 9:
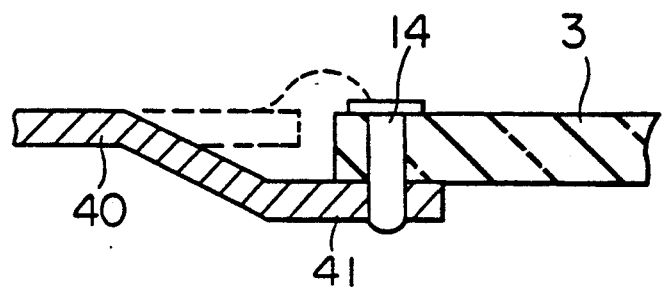
FIG. 9 is a schematic section showing another embodiment of the present invention.

In an embodiment as shown in FIG. 9, a board fixing pin 40 is bent so that the upper surface of the lead frame and the upper surface of the circuit board 3 will be on the same plane when the lower surface of the circuit board 3 is placed upon the upper surface of an inner end 41 of the board fixing pin 40. With this construction, wire bonding may be facilitated and the shape of mold may be uniformed for the spaces at above and under the circuit board 3, improving the fluidity of molding resin.

Figure 10:
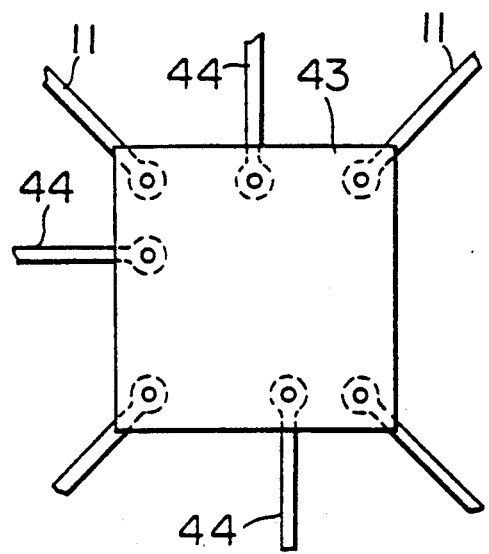
FIG. 10 is a schematic plan view showing another embodiment of the present invention, showing the linking positions between the circuit board and the board fixing pins.

In an embodiment shown in FIG. 10, a circuit board 43 is not only supported at the four corners thereof by the board fixing pins 11 but also fixed and supported at substantially the center portions of three sides thereof by board fixing pins 44. The board fixing pins at the corners may be removed, or it is also possible to support at some other positions.

Further, the circuit board may be of any type, and the number of electronic parts may be a plurality and the electronic parts may be provided on both surfaces thereof. Further, the semiconductor device may be any of QFP, DIP or SIP.

As has been described, in an electronic part mounting board of the present invention, a board fixing pin is provided on a lead frame which surrounds a circuit board and has a plurality of leads, in a manner extended from the frame so as to be coupled to the circuit board to support the circuit board with respect to the frame, and the circuit board and the board fixing pin are coupled to each other by a fitting pin for coupling the two members. Accordingly, the fitting pin is used for the linkage between the circuit board and the lead frame, whereby neither heating nor caulking is required. Thus, thermal deterioration of the resin board to be used and internal stress due to heat between the board and the lead frame do not occur, thereby fault at the time of mounting an electronic part and reduction in the reliability of finished products are not caused. Further, the present invention may be widely used, as it may be applied to almost any type of electronic part mounting board or semiconductor device, and is electrically highly reliable, since each individual lead is not constructed to be inserted into a through hole to be electrically connected thereto.

What is claimed is:

1. An electronic part mounting board comprising:
   a circuit board, for mounting an electronic part, having a conductor circuit adapted to be electrically connected to the electronic part;
   a lead frame including a frame disposed about said circuit board, said frame having a plurality of leads extended toward said circuit board from said frame in a manner capable of being electrically connected to said conductor circuit of said circuit board, and a board fixing pin extended from said frame and coupled to said circuit board to support said circuit board with respect to said frame; and
   a fitting pin extended through said circuit board and said board fixing pin to couple said circuit board and said board fixing pin.

2. The electronic part mounting board according to claim 1, wherein said circuit board and said board fixing pin having fitting holes, respectively, and said fitting pin is press-fitted to said fitting holes.

3. The electronic part mounting board according to claim 1, wherein said circuit board and said board fixing pin have fitting holes, respectively, and said fitting pin is fitted to an interior of said fitting holes so as to provide a play for absorbing thermal expansion between said fitting holes and said fitting pin.

4. The electronic part mounting board according to claim 1, wherein said board fixing pin is provided on a surface of said circuit board on which the electronic part is mounted.

5. The electronic part mounting board according to claim 2, wherein said fitting hole of said circuit board penetrates through the surface of said circuit board on which the electronic part is adapted to be mounted and the surface on the opposite side thereto.

6. The electronic part mounting board according to claim 1, wherein said fitting pin has a flange at one end thereof.

7. The electronic part mounting board according to claim 1, wherein said fitting pin has a flange at a point midway between opposite ends thereof.

8. A semiconductor device comprising:
   an electronic part;
   a circuit board mounting the electronic part, having a conductor circuit electrically connected to said electronic part;
   a sealing resin for sealing by means of a resin said circuit board together with said electronic part;
   leads disposed about said circuit board, each having an inner end embedded in said sealing resin and extended toward said circuit board and outer end extended externally of said sealing resin;

a bonding wire for electrically connecting said conductor circuit of said circuit board to said inner end of said lead;

a board fixing pin embedded in said sealing resin and having an inner end thereof coupled to said circuit board to support said circuit board; and a fitting pin extended through said circuit board and said board fixing pin to couple said circuit board and said board fixing pin.

9. The semiconductor device according to claim 8, wherein said circuit board and said board fixing pin have fitting holes, respectively, and said fitting pin is press-fitted to said fitting holes.

10. The semiconductor device according to claim 9, wherein said fitting hole of said circuit board penetrates through the surface of said circuit board on which electronic part is mounted and the surface on the opposite side thereto.

11. The semiconductor device according to claim 9, wherein said fitting pin has a flange at a point midway between opposite ends thereof.

12. The semiconductor device according to claim 8, wherein said circuit board and said board fixing pin have fitting holes, respectively, and said fitting pin is fitted to an interior of said fitting holes so as to provide a play for absorbing thermal expansion between said fitting holes and said fitting pin.

13. The semiconductor device according to claim 12, wherein said fitting pin has a flange at one end thereof.

14. The semiconductor device according to claim 8, wherein said board fixing pin is provided on a surface of said circuit board on which the electronic part is mounted.

* * * * *